United States Patent [19]
Ota

[11] Patent Number: 6,065,398
[45] Date of Patent: May 23, 2000

[54] SCREEN PRINTING METHOD AND APPARATUS

[75] Inventor: Tatsuki Ota, Tokyo, Japan

[73] Assignee: NEC Corporation, Tokyo, Japan

[21] Appl. No.: 09/185,619

[22] Filed: Nov. 4, 1998

[30] Foreign Application Priority Data

Nov. 4, 1997 [JP] Japan .................................. 9-301473

[51] Int. Cl.$^7$ .................................................. B05C 17/04
[52] U.S. Cl. ........................................ 101/123; 101/127.1
[58] Field of Search ................................... 101/123, 124, 101/129, 127, 127.1, 126

[56] References Cited

U.S. PATENT DOCUMENTS

| | | | |
|---|---|---|---|
| 4,781,114 | 11/1988 | Ericsson | 101/123 |
| 4,903,593 | 2/1990 | Masanao | 101/123 |
| 4,905,592 | 3/1990 | Sorel | 101/123 |
| 4,909,145 | 3/1990 | Ericsson | 101/123 |
| 5,265,533 | 11/1993 | Svantesson et al. | 101/123 |

FOREIGN PATENT DOCUMENTS

| | | |
|---|---|---|
| 63-256440 | 10/1988 | Japan . |
| 63-313895 | 12/1988 | Japan . |
| 5-185580 | 7/1993 | Japan . |
| 7-309003 | 11/1995 | Japan . |
| 8-118594 | 5/1996 | Japan . |

*Primary Examiner*—Ren Yan
*Attorney, Agent, or Firm*—Sughrue, Mion, Zinn, Macpeak & Seas, PLLC

[57] ABSTRACT

In a screen printing method of squeezing out ink or a paste placed on a screen plate, which is obtained by forming a predetermined pattern on a metal or polymeric fiber mesh base with a photosensitive resin, onto a work placed on a side of the screen plate on which the ink or paste is not placed, by using a squeegee through the screen plate, thereby transferring the pattern onto the work, the distance between the work and the screen plate during movement of the squeegee by changing both the distance between the work and the screen plate on a stroke start side of the squeegee and the distance between the work and the screen plate on a stroke end side of the squeegee. A screen printing apparatus is also disclosed.

8 Claims, 10 Drawing Sheets

SCREEN PRINTING METHOD AND APPARATUS

BACKGROUND OF THE INVENTION

1. Field of the Invention

The present invention relates to a screen printing method and apparatus.

2. Description of the Prior Art

In so-called screen printing, ink or a paste is squeezed out onto a substrate on which we want to print, which is placed on the opposite side of a screen plate obtained by forming a predetermined pattern on a metal or polymeric fiber mesh base with a photosensitive resin, through the screen plate by using a rubber, plastic, or metal blade called a squeegee, thereby transferring the pattern onto the substrate. Since screen printing can easily form a pattern on a relatively large area at a relatively low cost, the method has found more use over the years.

One characteristic way of using this method is its application to a large-area flat panel display typified by a plasma display. Application of the method to a plasma display demands high-precision printing quality as well as the capability of pattern formation on a large area in order to form a pattern of one million or more pixels on a large area of about 50 inches.

In the above screen printing method, as the squeegee moves on a screen plate while squeezing out ink or a paste onto a substrate to be printed (to be simply referred to as a work hereinafter) such as a printed board, the angle (to be referred to as the plate separation angle hereinafter) the screen plate (to he simply referred to as a plate hereinafter) separating from the work makes with this work upon completion of printing gradually decreases. This decrease in plate separation angle and the viscosity of ink or a paste make the plate difficult to separate from the work. That is, a degradation in plate separation properties occurs. This causes film thickness irregularity and line width irregularity, posing problems in screen printing for high-precision, large-area works.

For example, the above problems are traced back to irregularities which become more noticeable as the plate separation angle at an arbitrary squeegee position decreases in inverse proportion to the plate size with the distance (to be referred to as the clearance hereinafter) between the plate and the work remaining the same, and to low plate tension owing to a large plate size if the plate making technique level remains the same.

This problem may be effectively solved by ensuring a sufficient clearance. With an increase in clearance, however, the expansion of the overall plate increases. This increases the chance of irreversible expansion, resulting in short service life of the plate.

Efforts have been made to increase the plate tension by improving the plate making technique and the like. Even if, however, a high tension is attained, it is difficult to perfectly prevent a degradation in plate separation properties unless a certain plate separation angle or more can be maintained. As described previously, if the clearance remains the same, the plate separation angle at an arbitrary squeegee position decreases in inverse proportion to the plate size. It is therefore difficult to solve the above problem by only improving the plate making method, i.e., increasing the plate tension.

As a technique of improving plate separation properties without setting a large clearance, a printing technique (to be referred to as "off-contact printing" hereinafter) of improving plate separation properties by increasing the clearance of the plate in synchronism with the squeegee stroke, as shown in FIG. 1 in Japanese Unexamined Patent Publication No. 63-313895, has been proposed.

This technique will be briefly described below with reference to FIGS. 1A to 1D.

As shown in FIGS. 1A to 1D, a screen plate 1 stretched between screen frame members 1a and 1b and a work 2 are placed almost parallel to each other. In this case, the work 2 is fixed to a table (not shown) having a vacuum chucking mechanism and a high flatness precision. A pattern on the screen plate 1 is transferred onto the work 2 by squeezing out a paste placed on the screen plate 1 onto the work 2 with a squeegee 3 set in contact with the work 2 with a predetermined pressure.

One side of the screen plate 1 which is located on the start side of the squeegee 3 is raised in synchronism with the squeegee stroke, as shown in FIG. 1B. In this case, the screen 1 is linearly raised from the squeegee stroke start to the squeegee stroke end (see FIG. 1C).

The following is the reason why the screen plate 1 is linearly raised. With this operation, since two sides X and Y of the triangle defined by the screen mesh and the work surface after the plate separates from the work, which is indicated by the hatching in FIG. 1D, linearly change, geometrical similarity of the triangle is maintained. This allows printing, with a plate separation angle $\theta$ being kept perfectly constant, by setting the off-contact amount to an appropriate value in accordance with the clearance, thereby improving plate separation properties.

For example, FIG. 2 shows changes in plate separation angle $\theta$ (the ordinate) with respect to the squeegee stroke (the abscissa) when the off-contact amount is kept to 20 mm and the clearance is changed from 1 mm to 4 mm.

Note that the values shown in the graph of FIG. 2 are not measured values but are calculated values based on a simulation. As is obvious from this graph, when the clearance amount and the off-contact amount are set to 1 mm and 20 mm, respectively, the screen plate separation angle $\theta$ is constant.

As a contact printing technique, a technique using a mechanism like the one described in Japanese Unexamined Patent Publication No. 7-309003 has been proposed, with the same contents as those described above.

For the same purpose as that described above, a technique of improving plate separation properties by slowly lowering the work after or in synchronism with the squeegee stroke, as disclosed in Japanese Unexamined Patent Publication No. 5-185580, has been proposed. This technique has almost the same effect as that of the above method from the viewpoint of keeping the plate separation angle $\theta$ constant by slightly increasing the clearance.

In addition, in printing on a large area such as a plasma display, the printing area tends to become large with respect to the outer size of the plate frame as compared with conventional screen printing for the following reason. If a screen plate is to have a size with a margin on the peripheral portion as in the prior art, a large screen plate having a side with a length of about 2.5 m and a large printing machine on which this screen place can be set are required. This makes it difficult to manufacture plates and printing apparatuses with high precision.

A large printing area with respect to the outer size of the plate frame makes it difficult to print by only using a portion near the central portion of the screen plate which is high in tension uniformity and having a sufficient expansion margin. Since the pressure which the squeegee exerts on the work, i.e., the printing pressure, changes between the peripheral portion of the plate which has a relatively high tension and the central portion which has a relatively lower tension, film thickness irregularity and line width irregularity occur. In order to solve this problem, the clearance is minimized, a sturdy yet flexible squeegee is used, or the squeegee is placed upright in many cases.

Assume that since the expansion margin of a screen plate is not sufficient, it is used to print while the clearance is increased to some extent to ensure good printability. In this case, the expansion of the screen plate becomes excessive, resulting in a decrease in printing precision. This often leads to irreversible deformation of the screen plate and short service life of the screen plate. In many cases, such a problem can be prevented by setting a minimum clearance as a printing condition.

According to the conventional method described above, the plate separation properties of the screen plate can be greatly improved, but irreversible expansion of the plate cannot be completely prevented because the clearance increases as the plate is separated from the work although the clearance is small at the start of printing. In addition, a new problem develops. That is, since the clearance at the squeegee stroke start greatly differs from that at the squeegee stroke end, the pattern formed deforms unevenly in printing operation.

FIG. 3 shows changes in the expansion amount of the screen plate when the off-contact printing mechanism shown in FIGS. 1A to 1D is used. The values shown in FIG. 3 are not measured values but are calculated values.

The conditions given in this calculation are:

Off-contact operation: Off-contact operation is performed in synchronism with the squeegee stroke. When the squeegee moves by a stroke of 1,700 mm, the plate end portion on the squeegee start side is raised to a level of 20 mm.

Screen plate: The screen plate has an inner dimension of 1,340 mm. The screen mesh portion between screen frame members and the squeegee expands in the form of a triangle.

The expansion amount of the screen plate in the squeegee stroke direction is calculated when the squeegee is moved while the clearance value is changed to 0, 1, 2, 3, and 4 mm. Referring to FIG. 3, the squeegee stroke is plotted along the abscissa, and the screen plate expansion amount is plotted along the ordinate.

As is obvious from FIG. 3, the expansion amount change of the screen plate is relatively small in a region where the clearance is small (0 to 1 mm). However, as the clearance increases (2 mm or more), the expansion of the screen plate abruptly increases. As a result, the difference between the expansion amount on the squeegee start side and that on the squeegee end side is especially noticeable.

When a conductive paste (silver paste NP-4028 available from NORITAKE CO., LTD.) was printed on a soda-lime glass substrate in a 40-inch electrode pattern under the above conditions by using a 1,500-mm square screen plate (inner dimension: 1,340 mm) with so-called combination lining (available from Tokyo Process Service K.K.), obtained by covering the peripheral portion of a plate with a polyester printing mesh and also covering the inner portion of the plate with a stainless printing mesh (SX300 mesh was used in this case), good plate separation properties were observed in a case wherein the clearance was 4 mm or more (the squeegee stroke speed was 20 mm/s).

Of the conditions shown in FIG. 3, the condition indicated by the curve with a clearance of 4 mm allows printing while satisfactory plate separation properties can be ensured. With a smaller clearance amount, film thickness irregularity and a deterioration in surface state are caused by a deterioration in plate separation properties. That is, high-precision printing under this condition is not practical.

Although the effect shown in FIG. 3 can be obtained when the practical clearance is set to the minimum value, i.e., 4, since uneven pattern deformation occurs in off-contact printing shown in FIGS. 1A to 1D, it is difficult to use this technique for the manufacture of a large plasma display.

In order to prevent uneven expansion, the plate separation properties on the squeegee end side can be improved by moving the plate or the work in the direction in which the clearance increases upon completion of a squeegee stroke. With this technique, however, since irregularity due to a deterioration in plate separation properties during the squeegee stroke cannot be eliminated, a radical improvement cannot be expected.

Although printing with zero clearance, i.e., so-called contact printing, produces no irregularity due to a deterioration in plate separation properties, the paste spreads, and uniform separation of the plate from the work is difficult. This technique cannot easily provide a solution either. For this reason, in the off-contact screen printing method shown in FIGS. 1A to 1D, a serious problem is experienced in micromachining on a large area such as a plasma display.

According to a method of preventing printing irregularity on the peripheral portion of a screen plate with a large pattern size by changing the printing conditions, since main conditions for printing, such as clearance, squeegee hardness, and squeegee angle are limited, the working margin reduces, resulting in low yield.

In addition, in the method of preventing printing irregularity on the peripheral portion of a screen plate with a large pattern size by changing the printing conditions, the clearance must be suppressed. This limitation reduces the working margin, resulting in low yield again. This method can be improved by using the above off-contact printing technique together because the initial clearance can be minimized. However, since the clearance actually increases on the squeegee end side, irregularity and uneven expansion of the screen plate due to variations in printing pressure become worse.

SUMMARY OF THE INVENTION

The present invention has been made in consideration of the above situation, and has as its object to allow printing while sufficiently suppressing any change in the expansion amount of a screen plate upon squeegee movement and reduce pattern deformation and expansion/contraction during printing, thereby improving the yield and prolonging the service life of the screen plate.

In order to achieve the above object, according to the first main aspect of the present invention, there is provided a screen printing method characterized in that the distance between a work and a screen plate during movement of a squeegee is changed by changing both the distance between the work and the screen on the squeegee stroke start side and the distance between the work and the screen plate on the squeegee stroke end side.

In the first main aspect, the distance between the work and the screen is changed in synchronism with a squeegee stroke.

In addition, in the first main aspect, the distance between the work and the screen is changed by independently moving one side of the screen plate which is located on the squeegee stroke start side and the other side of the screen plate which is located on the squeegee stroke end side.

Furthermore, in the first main aspect, the distance between the work and the screen plate is changed by moving one side of the screen plate which is located on the squeegee stroke start side and the other side of the screen plate which is located on the squeegee stroke end side in opposite directions.

In order to achieve the above object, according to the second main aspect of the present invention, there is provided a screen printing apparatus characterized by including a mechanism capable of changing the distance between a work and a screen plate during movement of a squeegee by changing both the distance between the work and the screen on the squeegee stroke start side and the distance between the work and the screen plate on the squeegee stroke end side.

The mechanism capable of changing the distance between the work and the screen plate according to the second main aspect operates in synchronism with a squeegee stroke.

The mechanism capable of changing the distance between the work and the screen plate according to the second main aspect can move one side of the screen plate which is located on the squeegee stroke start side and the other side of the screen plate which is located on the squeegee stroke end side in opposite directions.

In order to achieve the above object, according to the third main aspect of the present invention, there is provided a screen printing apparatus characterized by comprising a mechanism capable of independently moving both one side of a screen plate which is located on the squeegee stroke start side and the other side of the screen plate which is located on the squeegee stroke end side, and a squeegee mechanism capable of printing on a work when the squeegee moves on a forward path and a backward path.

According to the present invention having the above aspects, printing can be performed while a change in the expansion amount of the screen plate upon squeegee movement is sufficiently suppressed without any deterioration in plate separation properties during printing. In addition, pattern deformation and expansion/contraction during printing can be reduced, and an improvement in yield can be attained. Furthermore, the service life of the screen plate can be prolonged.

In addition, since the expansion/contraction of the screen plate can be controlled to remain uniform to some extent, the expansion/contract of the same screen plate can be matched with changes in the dimensions of the work while the same screen plate is used.

Since the clearances at the start and end portions of the screen plate which have high tension can be reduced, variations in printed film thickness due to changes in printing pressure can be suppressed, and an improvement in printing yield can be attained.

Furthermore, since the expansion/contraction of the screen plate can be controlled to remain uniform to some extent, irreversible expansion of the screen plate can be suppressed, and the service life of the screen plate can be prolonged.

As described above, in printing a large-area, high-precision pattern, a uniform pattern with little deformation can be formed, and a high-precision, uniform pattern can be formed without using a high-cost thin film process. Therefore, large, high-precision patterns can be mass-produced at a low cost.

As described above, according to the screen printing method and apparatus of the present invention, printing can be performed while a change in the expansion amount of the screen plate upon squeegee movement is sufficiently suppressed without any deterioration in plate separation properties during printing. In addition, pattern deformation and expansion/contraction during printing can be reduced, and an improvement in yield can be attained. Furthermore, the service life of the screen plate can be prolonged.

Moreover, the expansion/contraction of the screen plate can be matched with changes in the dimensions of the work within a certain range while the same screen plate is used.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described in detail below with reference to the accompanying drawings.

Figure 4A:
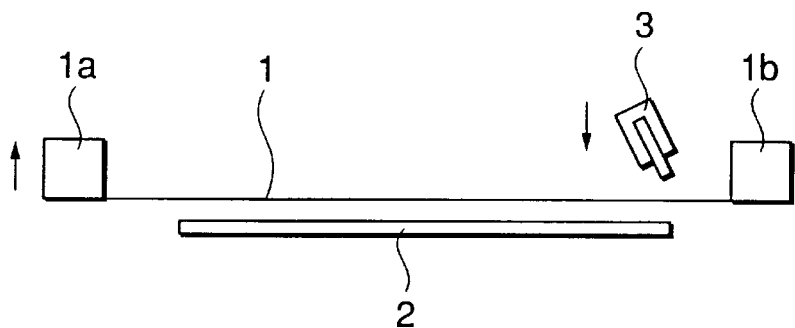
FIGS. 4A to 4C are schematic views showing part of a screen printing apparatus according to the first embodiment of the present invention.
Figure 4B:
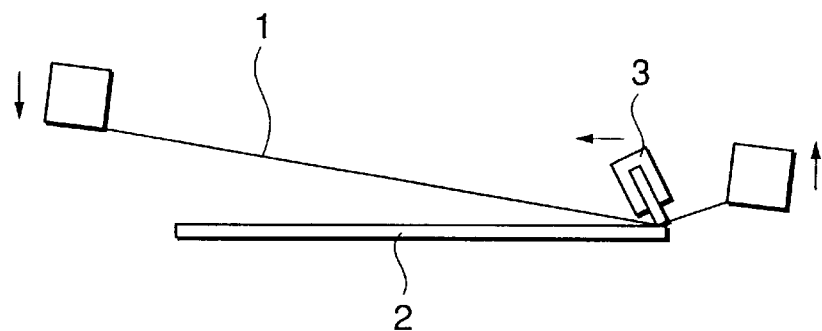
Figure 4C:
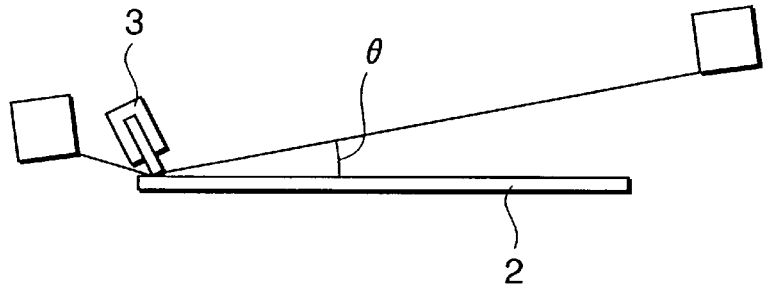

FIGS. 4A to 4C are schematic views showing part of a screen printing apparatus according to the first embodiment of the present invention.

As shown in FIG. 4A, a screen plate 1 and a work 2 are placed almost parallel to each other. In this case, the work 2 is fixed to a table (not shown) having a vacuum chucking mechanism and a high flatness precision. A pattern on the screen plate 1 is transferred onto the work 2 by squeezing out a paste (not shown) placed on the screen plate 1 with a squeegee 3 set in contact with the work 2 with a predetermined pressure.

In this case, one side of the screen plate 1 which is located on the stroke start side of the squeegee 3 is raised in synchronism with the squeegee stroke, as shown in FIG. 4B. At the same time, one side of the screen plate 1 which is located on the stroke end side of the squeegee 3 is raised first to a predetermined level at the start of the squeegee stroke, and is then lowered in synchronism with the squeegee stroke, as shown in FIG. 4C.

In this case, the screen plate 1 is raised and lowered linearly from the stroke start to the stroke end. Off-contact printing in the present invention will be referred to as "double-sided off-contact printing", and conventional off-contact printing shown in FIGS. 1A to 1D will be referred to as "single-sided off-contact printing" hereinafter.

Figure 5:
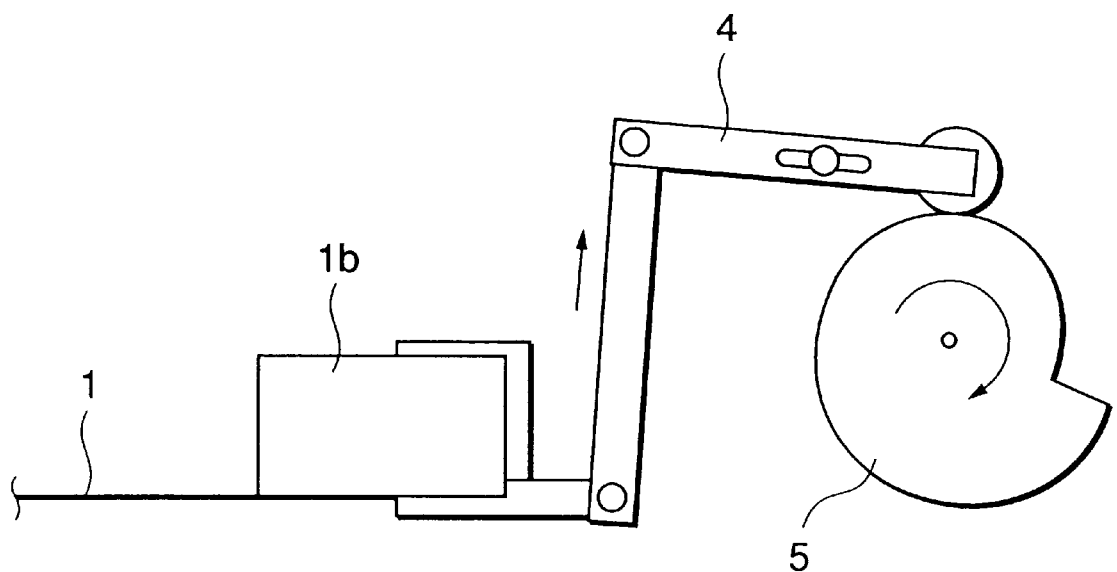
FIG. 5 is a schematic view for explaining a mechanism for realizing off-contact printing by using a cam that is adjusted to make almost one turn at the maximum stroke of a squeegee in synchronism with its movement.

FIG. 5 schematically shows a mechanism for realizing off-contact operation by using a cam 5 that is adjusted to make almost one turn at the time of the maximum stroke of the squeegee 3 in synchronism with the movement of the squeegee 3. In this mechanism, the ascent amount of the screen plate 1 changes in accordance with the rotation of the cam 5 and the fixing position of an adjustable shaft 4. Although FIG. 5 shows only the manner in which the screen plate 1 is raised, a mechanism for lowering the screen plate 1 can be realized by rotating the cam 5 in the reverse direction.

Figure 6:
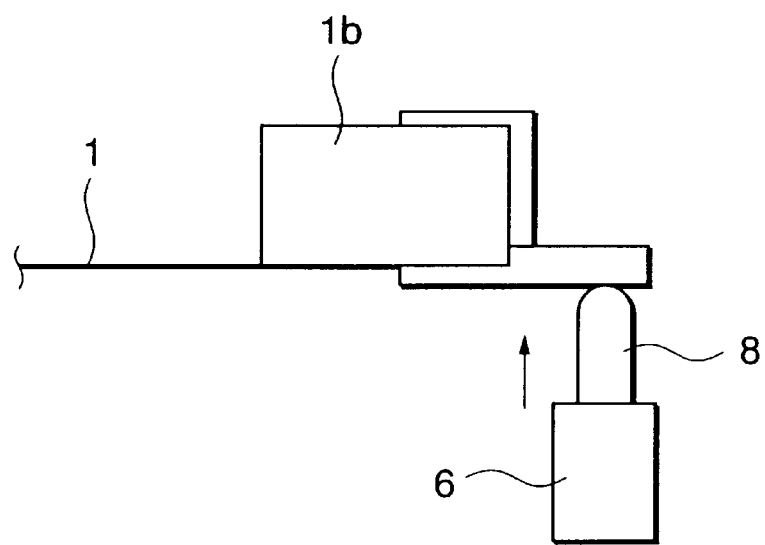
FIG. 6 is a schematic view for explaining a mechanism for realizing off-contact printing by using a pulse motor that is linearly driven in synchronism with the movement of the squeegee.

FIG. 6 is a schematic view showing a mechanism for realizing off-contact operation by using a pulse motor 6 that operates with a linear stroke in synchronism with the movement of the squeegee 3.

In this mechanism, the pulse motor 6 is linearly operated in accordance with squeegee movement information received from a signal system for driving the squeegee 3 so as to raise a screen plate push pin 8, thereby raising the screen plate 1. Although FIG. 6 shows only the manner in which the screen plate 1 is raised, a mechanism for lowering the screen plate 1 can be realized by driving the pulse motor 6 in the reverse direction.

Note that in each of the mechanisms shown in FIGS. 5 and 6, the zero point or the descent start point can be set to a predetermined position (not shown).

Figure 7:
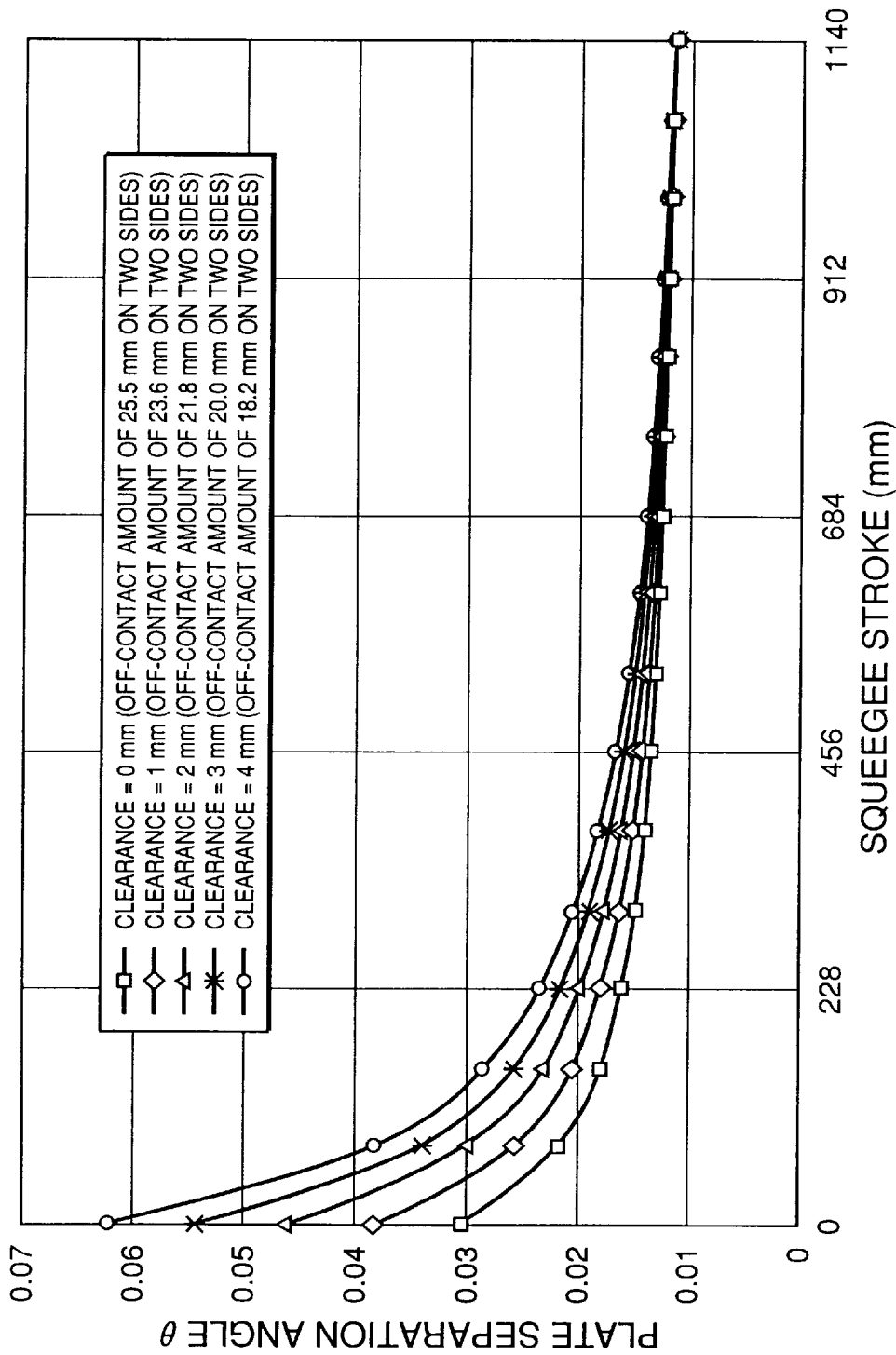
FIG. 7 is a graph showing changes in plate separation angle in the first embodiment shown in FIGS. 4A to 4C.

FIG. 7 shows changes in plate separation angle $\theta$ in double-sided off-contact printing in the first embodiment. The values shown in FIG. 7 are not measured values but are calculated values based on a simulation.

The conditions given in this calculation are:
a. Off-contact operation is performed in synchronism with the squeegee stroke. When the squeegee 3 moves by a stroke of 1,700 mm, the plate end portion on the squeegee start side is raised to a level of 20 mm. At the same time, the plate end portion on the squeegee stroke end side is raised first to a level of 20 mm, and is then lowered to the zero level.
b. The screen plate 1 has an inner dimension of 1,340 mm. The mesh portion of the screen plate 1 between screen frame members 1a and 1b and the squeegee 3 expands in the form of a triangle.

Under these conditions, the expansion amount of the screen plate 1 in the squeegee stroke direction is calculated when the squeegee 3 is moved while the off-contact amount (mm) is set such that a minimum plate separation angle $\theta_0$ becomes 0.01128° and the clearance value is changed to 0, 1, 2, 3, and 4 mm. Referring to FIG. 7, the squeegee stroke is plotted along the abscissa, and the screen plate expansion amount is plotted along the ordinate. In this case, 0.01128° used as the minimum plate separation angle $\theta_0$ is an experimental value corresponding to the minimum value with which good plate separation properties can be ensured when a single-sided off-contact mechanism is used.

Obviously, with the use of the double-sided off-contact mechanism, angle changes can be suppressed while the plate separation angle $\theta$ is kept equal to or larger than a predetermined value by optimizing the clearance and the off-contact amount.

Figure 1A:
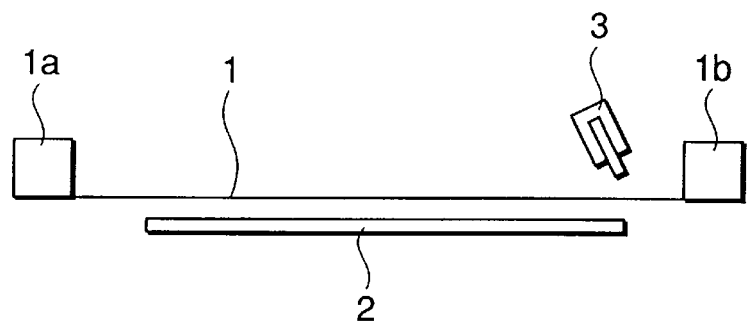
FIGS. 1A to 1D are schematic views showing part of the conventional apparatus disclosed in Japanese Unexamined Patent Publication No. 63-313895.
Figure 1B:
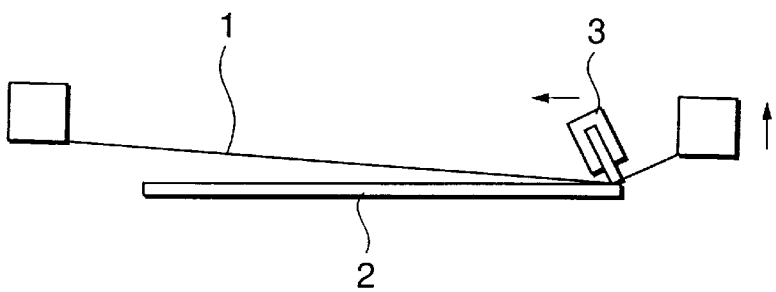
Figure 1C:
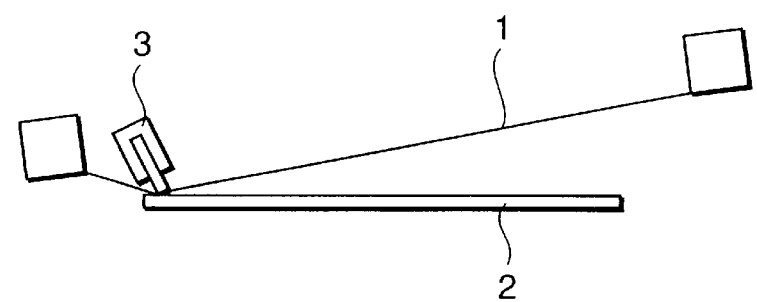
Figure 1D:
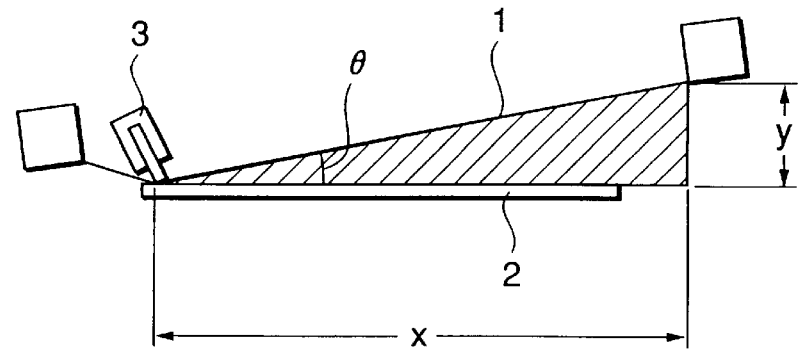
Figure 2:
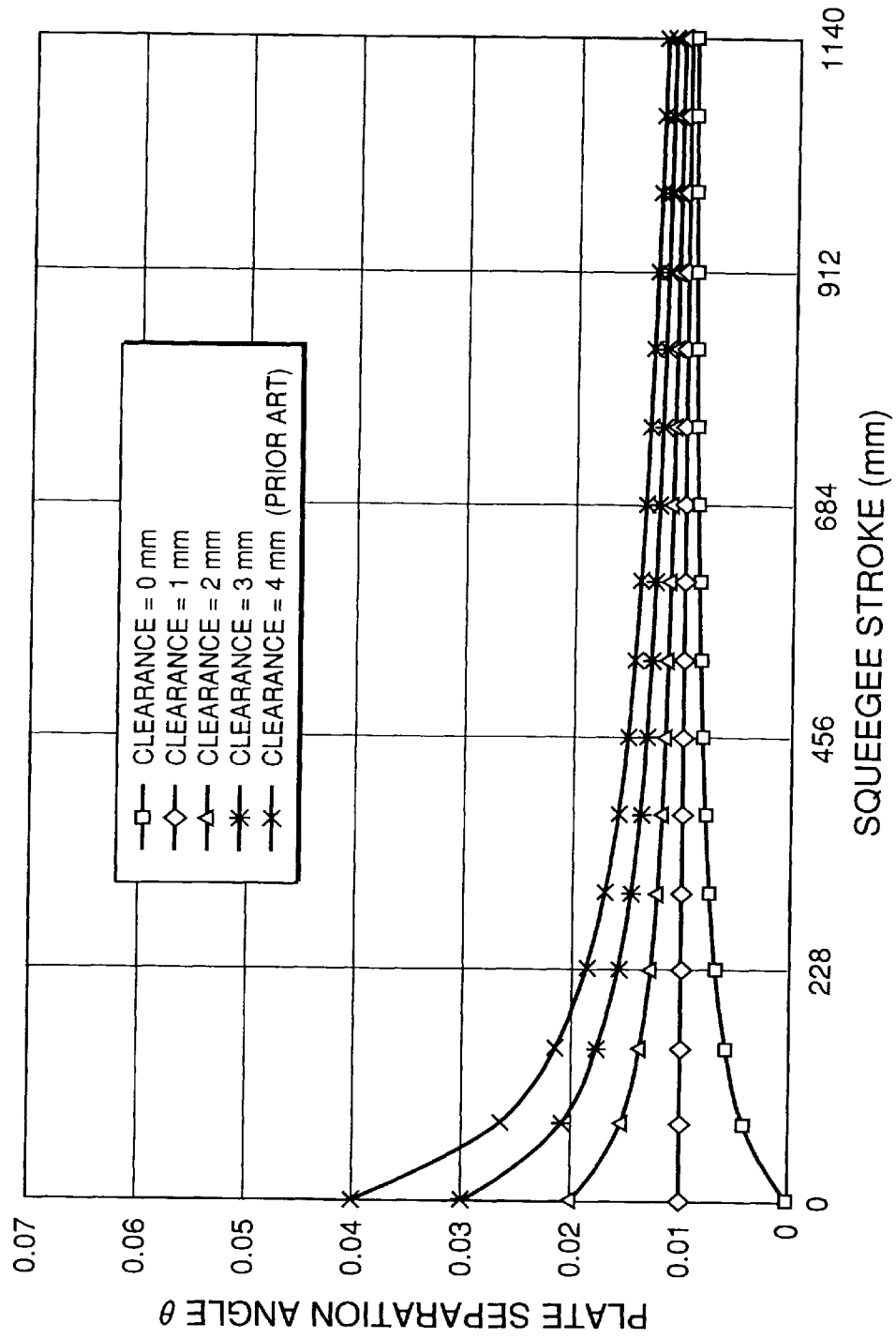
FIG. 2 is a graph showing charges in plate separation angle in the conventional apparatus shown in FIGS. 1A to 1D.
Figure 3:
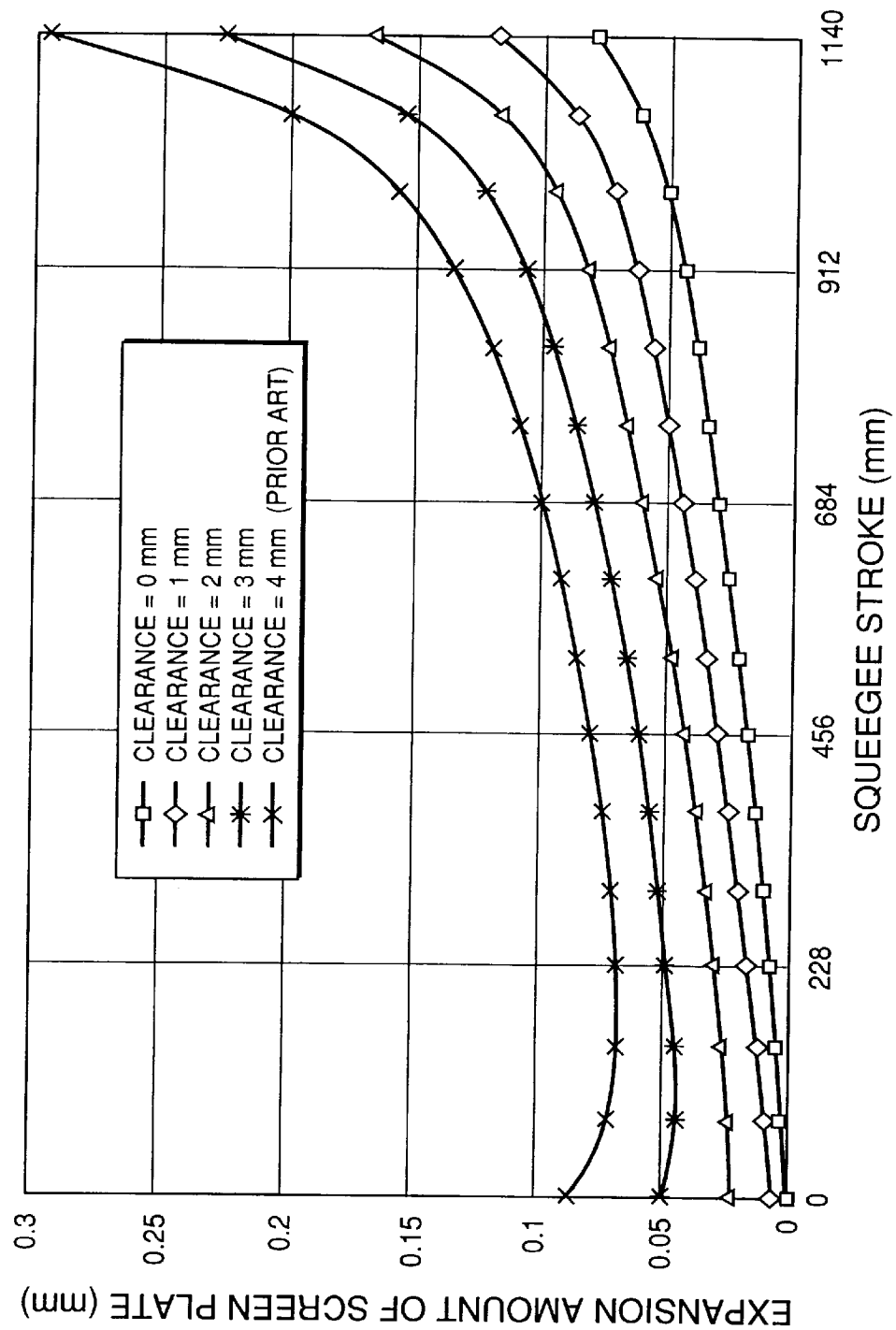
FIG. 3 is a graph showing changes in the expansion amount of a screen plate in the conventional apparatus shown in FIGS. 1A to 1D.
Figure 8:
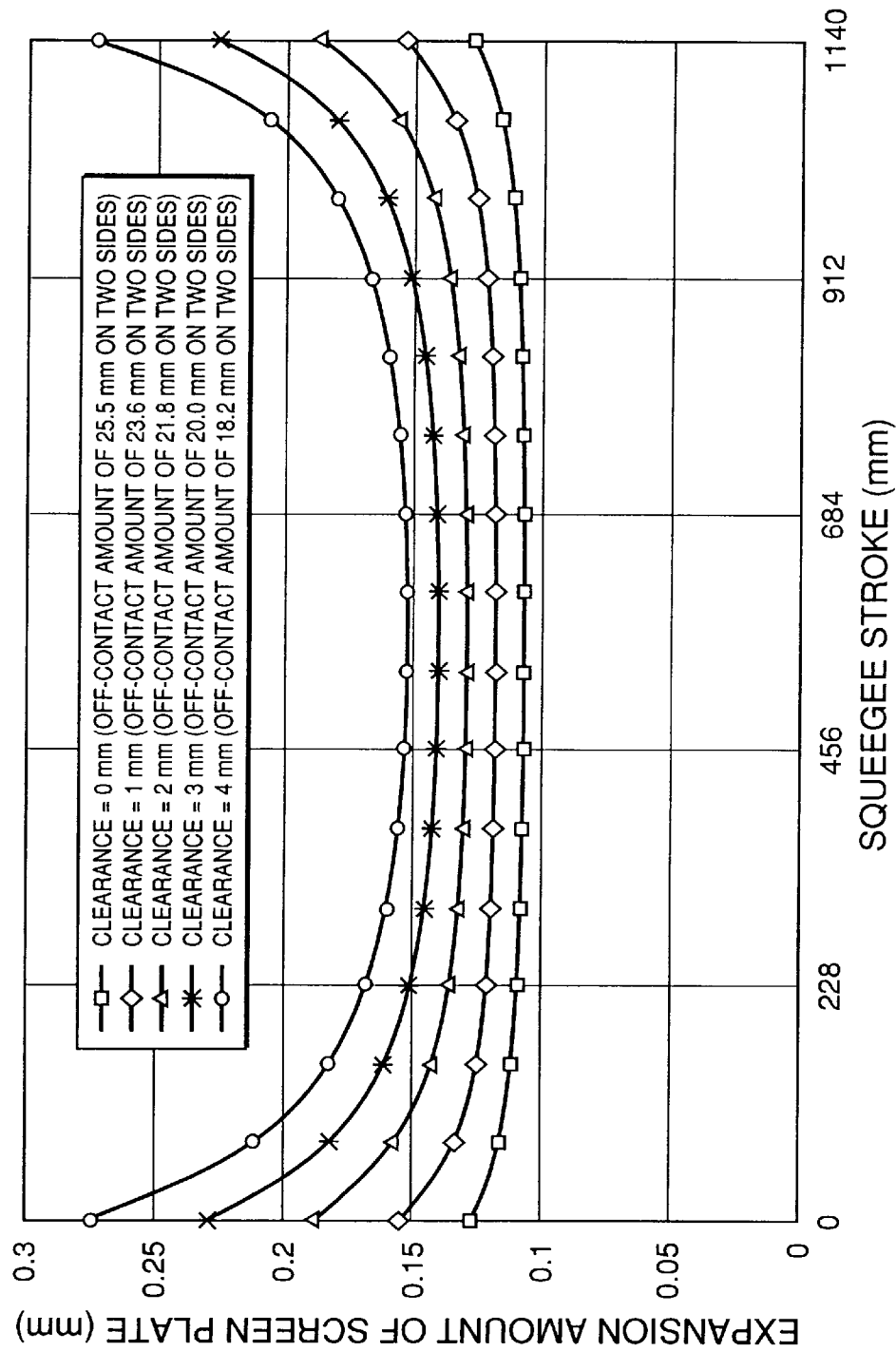
FIG. 8 is a graph showing changes in the expansion amount of the screen plate under the printing conditions in FIG. 7.

FIG. 8 shows changes in the expansion amount of the screen plate 1 under the printing conditions in FIG. 7. FIG. 3 shows changes in the expansion amount of the screen plate 1 with the conventional single-sided off-contact mechanism.

As is apparent from FIG. 8, with the double-sided off-contact mechanism, the expansion change of the screen plate 1 assumes a symmetrical form to attain higher uniformity as compared with the single-sided off-contact mechanism shown in FIG. 3. In addition, when the clearance is decreased while the plate separation angle $\theta$ is kept equal to or larger than the predetermined value, changes in the expansion amount of the plate greatly reduce, allowing printing with a minimum pattern change.

According to the curve with clearance=0 in FIG. 8, the maximum expansion amount of the screen plate 1 is about 0.128 mm, and the minimum expansion amount is about 0.110 mm. That is, the difference between the maximum and minimum values is as small as about 0.018 mm. Considering that the cell pitches of plasma displays on the market range from about 0.21 to 0.36 mm, no practical problem is posed in terms of precision. That is, deformation due to the expansion of the screen plate 1 can be minimized without increasing the clearance while good plate separation properties are maintained.

Obviously, as compared with the single-sided off-contact mechanism, in a practical set range, the expansion amount of a plate portion located near the squeegee stroke end and having a high tension and a small mesh expansion margin is suppressed, and irreversible deformation does not easily occur. That is, the service life of the plate can be prolonged.

Figure 9:
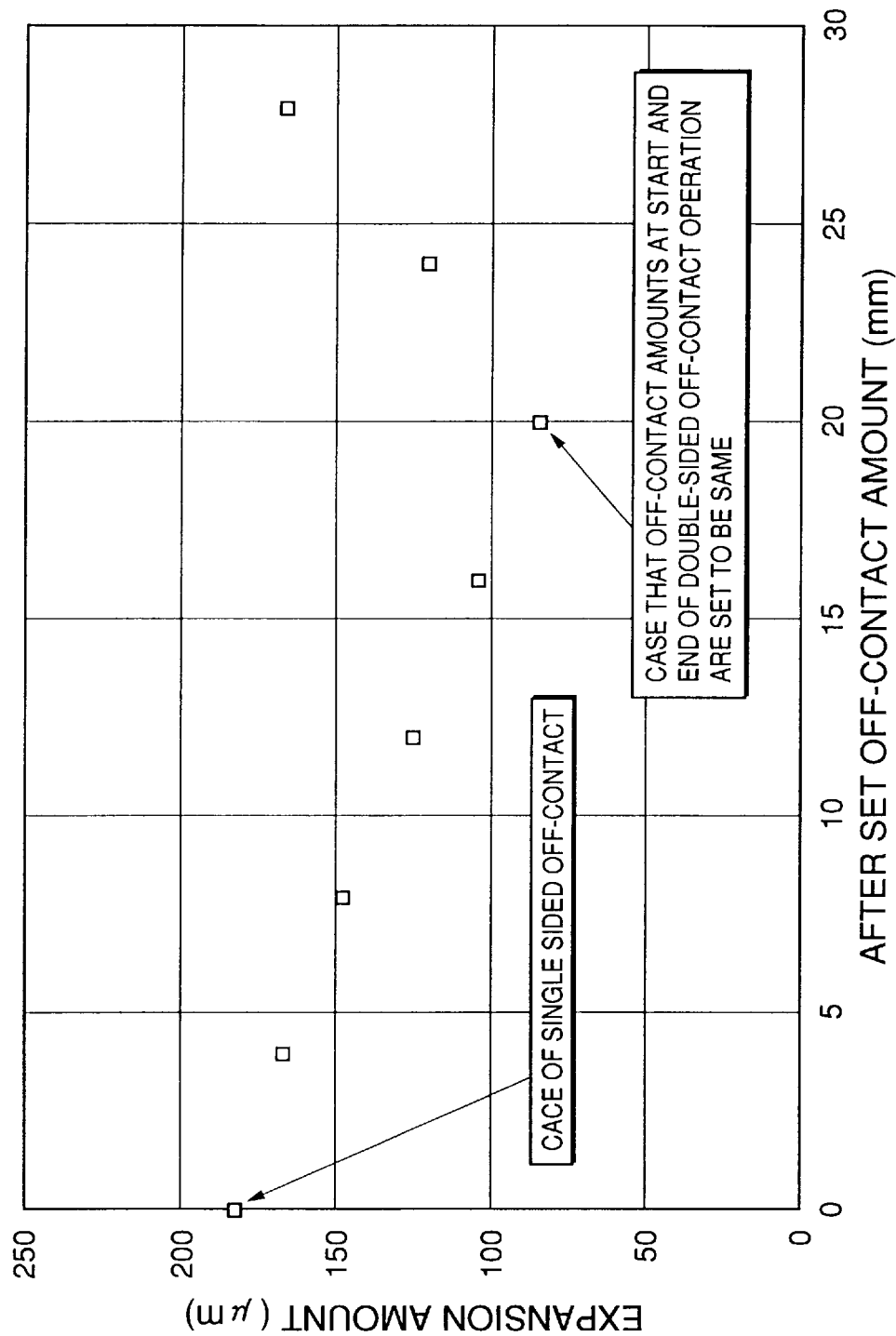
FIG. 9 is a graph showing changes in plate expansion amount when only the off-contact amount on one side is changed.

In this case, the off-contact amounts at the start and end of double-sided off-contact operation are set to be the same. This is because, as shown in FIG. 9, the expansion change amount of the screen plate 1, obtained when the off-contact amount and the clearance on the ascent side are kept constant while the off-contact amount on the descent side is changed, is minimized when the above two values are equal to each other. In addition, each expansion amount change is calculated in a direction parallel to the squeegee stroke direction.

When a conductive paste (silver paste NP-4028 available from NORITAKE CO., LTD.) was printed on a work (soda-lime glass substrate) in a 40-inch electrode pattern under the above conditions by using a 1,500-mm square screen plate (inner dimension: 1,340 mm) with so-called combination lining (available from Tokyo Process Service K.K.), obtained by covering the peripheral portion of a plate with a polyester printing mesh and also covering the inner portion of the plate with a stainless printing mesh (SX300 mesh was used in this case), good plate separation properties were observed with clearance=0 mm and off-contact amount=18 mm. This indicates that actual printing could be performed under conditions for higher precision as compared with the above calculated values, although you cannot generalize about the above effect because the absolute value varies depending on differences among screen plates 1, the specifications, the paste to be used, and the pattern to be used.

The following effect was also confirmed.

When a printed pattern shrinks beyond a predetermined value and deforms into an almost trapezoidal shape on the squeegee stroke start side, the pattern can be corrected to a shape close to a predetermined shape by increasing the off-contact amount on the squeegee stroke end side within the range in which printability is not impaired. When the pattern shrinks on the squeegee stroke end side, the same effect as described above can be obtained by increasing the off-contact amount on the squeegee stroke start side.

When the pattern deforms in the form of a barrel, i.e., both the pattern portions on the squeegee stroke start and end sides shrink as compared with the pattern middle portion, the pattern can be corrected to a shape close to the predetermined shape by increasing the clearance amount.

In addition, when the pattern deforms in the form of a barrel with the pattern middle portion expanding with respect to the squeegee stroke start and end sides, the pattern can be corrected to a shape close to the predetermined shape by increasing the off-contact amounts on the two sides.

When the pattern deforms in the form of a pincushion, the pattern can be corrected to a shape close to the predetermined shape by taking the reverse measure.

If the overall pattern deforms in the expansion direction, it is difficult to correct the pattern. If, however, the pattern is properly reduced as a whole before it is printed on the screen plate 1, deformation of the screen plate 1 can be properly handled to a considerable extent. This technique is very effective.

This is because, pattern deformation due to off-contact operation can be used for pattern deformation correction. In the single-sided off-contact scheme, patterns that can be corrected are limited to trapezoidal patterns each shrinking on the squeegee stroke end side. In contrast to this, in the double-sided off-contact scheme, as described above, many types of deformed patterns can be corrected to some extent.

FIGS. 10A to 10D are schematic views showing part of a screen printing apparatus according to the second embodiment of the present invention.

Figure 10A:
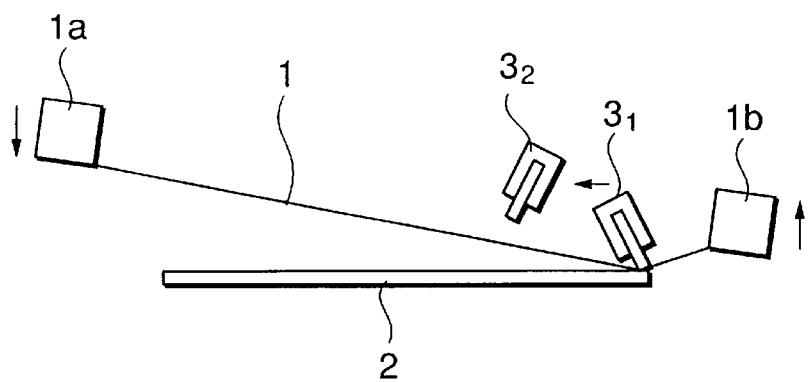
FIGS. 10A to 10D are schematic views showing part of a screen printing apparatus according to the second embodiment of the present invention.

As in the first embodiment, after a screen plate 1 and a work 2 are placed almost parallel to each other, a pattern on the screen plate 1 is transferred onto the work 2 by moving a squeegee $3_1$, which is set in contact with the work 2 with a predetermined pressure, from the right to the left (forward path), as shown in FIG. 10A, while a paste (not shown) on the screen plate 1 is squeezed out with the squeegee $3_1$.

Figure 10B:
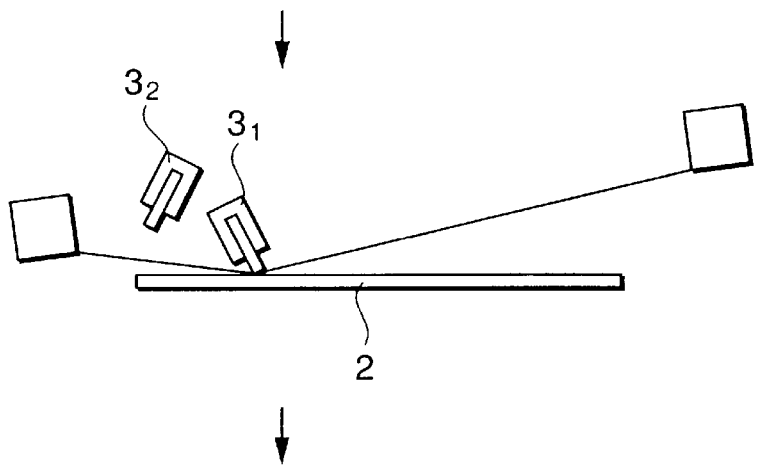

At this time, as shown in FIG. 10A, one side of the screen plate 1 which is located on the stroke start side of the squeegee $3_1$ is raised in synchronism with the squeegee stroke. At the same time, one side of the screen plate 1 which is located on the stroke end side of the squeegee $3_1$ is raised first to a predetermined level at the start time of the squeegee, and is then lowered in synchronism with the squeegee stroke, as shown in FIG. 10B. In this case, the screen plate 1 is raised and lowered linearly from the stroke start to the stroke end, as in the first embodiment.

Figure 10C:
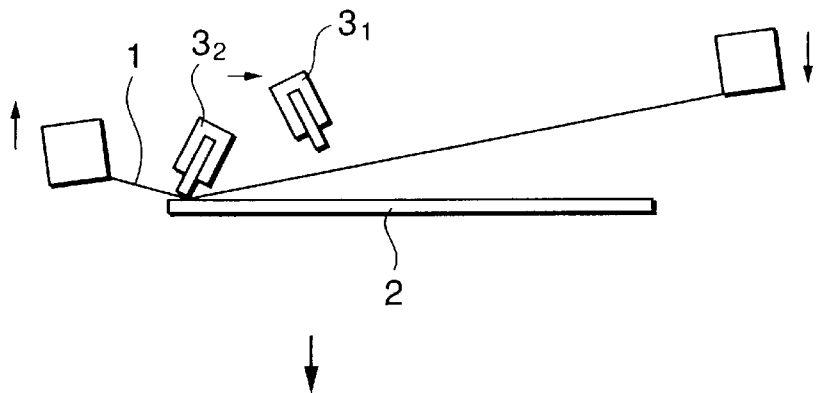
Figure 10D:
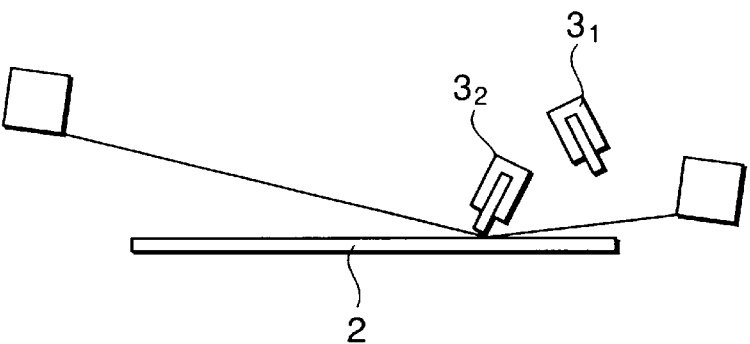

When the transfer of the pattern onto the work 2 is complete, the work 2 is replaced with another work. After that, as shown in FIG. 10C, a pattern is transferred onto the work 2 by moving a squeegee $3_2$ from the left to the right (backward path), i.e., the reverse direction to that in the above off-contact operation in which the squeegee moves from the right to the left. That is, the first embodiment, in which double-sided off-contact operation is performed in a single direction, is improved such that double-sided off-contact operation can be performed in the forward and backward directions. The mechanisms used for this off-contact operation are the same as those in the first embodiment. In this embodiment, each mechanism is not dedicated to ascending or descending operation but is designed to control movements in both directions.

The screen printing apparatus of this embodiment realizes sufficiently good plate separation properties and can shorten the cycle time of printing. In addition, when it is difficult to coat the screen plate 1 with a paste by using a scraper because of, for example, the viscosity of the paste, i.e., high or lower viscosity, continuous printing can be performed without paste coating. Furthermore, since no scraper is used, film thickness irregularity and spreading of the paste on the lower surface of the plate can be prevented.

Figure 11A:
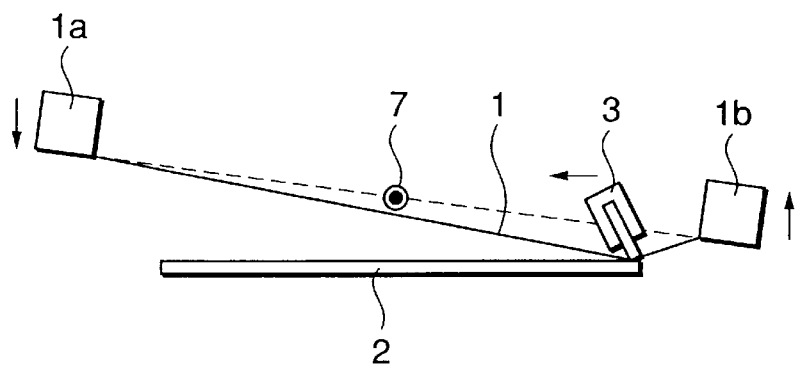
FIGS. 11A and 11B are schematic views showing part of a screen printing apparatus according to the third embodiment of the present invention.
Figure 11B:
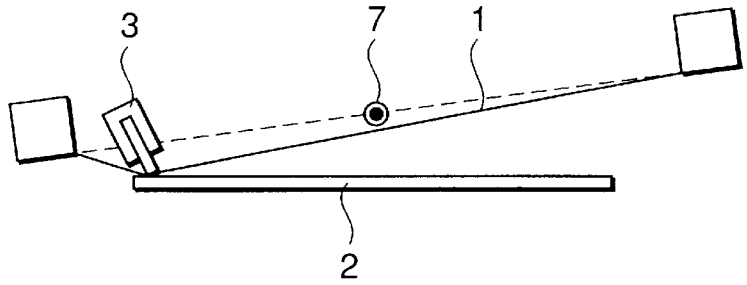

FIG. 11 is a schematic view showing part of a screen printing apparatus according to the third embodiment of the present invention.

In this embodiment, a rotating shaft is placed on the middle portion (in the squeegee stroke direction) of a holder (not shown) for holding a screen plate 1, and off-contact operation is performed around this shaft. As shown in FIG. 9, printing can be performed with a minimum expansion amount of the plate under the condition in which the ascent and descent off-contact amounts are set to be equal to each other. For this reason, double-sided off-contact printing can be satisfactorily performed even by using such a mechanism.

According to the screen printing apparatus of the third embodiment, printing cannot be performed unless the off-contact settings on the right and left sides are the same. However, since the position of the rotating shaft for off-contact operation is mechanically determined, the mechanical precision can be increased, and the work quality can be improved.

In addition, if an off-contact mechanism is placed at either the start or end of the squeegee stroke, a predetermined operation can be performed, and the apparatus cost can be decreased. Since this apparatus need not have a plurality of complicated mechanisms, the yield of printing apparatuses increases.

What is claimed is:

1. A double-sided off-contact screen printing apparatus, comprising:

a screen plate having a predetermined pattern;

at least one squeegee to pass a medium to be transferred to an object through said predetermined pattern of said screen plate and thereby transfer said predetermined pattern onto said object;

a means for changing a distance between said object and said screen plate during movement of said squeegee by changing both a distance between said object and said screen plate on a stroke start side of said squeegee and a distance between said object work and said screen plate on a stroke end side of said squeegee, wherein each of said stroke start side and said stroke end side of said screen plate is disposed to be at a position higher, relative to said object, than a contact point between said squeegee and said screen plate, a holder which holds said screen plate; and a rotatable shaft disposed in a middle portion of said holder, said rotatable shaft extending transversely across said holder in a direction substantially perpendicular to a stroke direction of said squeegee.

2. A double-sided off-contact screen printing apparatus according to claim 1, wherein said means for changing a distance between said object and said screen plate operates in synchronism with a stroke of said squeegee.

3. A double-sided off-contact screen printing apparatus according to claim 2, wherein said means for changing a distance between said object and said screen plate is configured to independently move one side of said screen plate located on said stroke start side of said squeegee and another side of said screen plate which is located on said stroke end side of said squeegee.

4. A double-sided off-contact screen printing apparatus according to claim 3, wherein said means for changing a distance between said object and said screen plate is configured to move one side of said screen plate located on said stroke start side of said squeegee and another side of said screen plate which is located on said stroke end side of said squeegee in opposite directions.

5. A double-sided off-contact screen printing apparatus according to claim 4, further comprising a squeegee mechanism capable of printing on an object in both a forward path and a backward path of said squeegee.

6. A double-sided off-contact screen printing apparatus according to claim 5, wherein said squeegee mechanism comprises at least a first squeegee which prints on an object in a first direction and a second squeegee which prints on said object in a second direction opposite to said first direction.

7. A double-sided off-contact screen printing apparatus according to claim 2, wherein off-contact settings on each of said stroke start side and said stroke end side are maintained substantially equal.

8. A double-sided off-contact screen printing apparatus according to claim 1, wherein said means for changing a distance between said object and said screen plate further comprises a cam configured to adjust said distance between said object and said screen plate in synchronism with a movement of said squeegee.

* * * * *